(12) United States Patent
Book

(10) Patent No.: US 8,481,867 B2
(45) Date of Patent: Jul. 9, 2013

(54) CONDUCTIVE GROUNDING PAD

(75) Inventor: Alf Martin Book, Torslanda (SE)

(73) Assignee: Brady Converting AB, Kungalv (SE)

( * ) Notice: Subject to any disclaimer, the term of this patent is extended or adjusted under 35 U.S.C. 154(b) by 186 days.

(21) Appl. No.: 13/186,562

(22) Filed: Jul. 20, 2011

(65) Prior Publication Data

US 2012/0018211 A1    Jan. 26, 2012

Related U.S. Application Data

(60) Provisional application No. 61/365,837, filed on Jul. 20, 2010.

(51) Int. Cl.
*H05K 9/00* (2006.01)

(52) U.S. Cl.
USPC ........... 174/355; 174/356; 174/390; 174/394; 277/920

(58) Field of Classification Search
USPC .................. 174/356, 355, 390, 394; 277/920
See application file for complete search history.

(56) References Cited

U.S. PATENT DOCUMENTS

| | | | |
|---|---|---|---|
| 4,857,668 A | 8/1989 | Buonanno | |
| 5,028,739 A * | 7/1991 | Keyser et al. | 174/357 |
| 5,115,104 A | 5/1992 | Bunyan | |
| 5,142,101 A | 8/1992 | Matsuzaki et al. | |
| 5,286,568 A | 2/1994 | Bacino et al. | |
| 5,367,123 A * | 11/1994 | Plummer et al. | 174/36 |
| 5,401,901 A * | 3/1995 | Gerry et al. | 174/391 |
| 5,569,877 A | 10/1996 | Yumi | |
| 5,656,795 A * | 8/1997 | Miska | 174/356 |
| 5,712,449 A * | 1/1998 | Miska et al. | 174/356 |
| 5,804,762 A * | 9/1998 | Jones et al. | 174/358 |
| 6,255,581 B1 | 7/2001 | Reis et al. | |
| 6,388,893 B1 | 5/2002 | Calderon | |
| 6,455,770 B2 * | 9/2002 | Pulver | 174/394 |
| 6,541,698 B2 * | 4/2003 | Miska | 174/358 |
| 6,768,052 B2 * | 7/2004 | Yamada et al. | 174/394 |
| 6,972,366 B2 * | 12/2005 | Yen et al. | 174/394 |
| 7,214,889 B2 * | 5/2007 | Mazurkiewicz | 174/386 |
| 2004/0194988 A1 * | 10/2004 | Chen | 174/350 |
| 2006/0272855 A1 | 12/2006 | Rutherford et al. | |
| 2009/0114438 A1 | 5/2009 | van Haaster | |

* cited by examiner

*Primary Examiner* — Hung Ngo
(74) *Attorney, Agent, or Firm* — Whyte Hirschboeck Dudek S.C.

(57) ABSTRACT

Compressible grounding pads with two conductor layers separated by a compressible foam layer comprise:
- (A) A first conductor layer, e.g., copper foil;
- (B) A first adhesive layer in direct contact with a part of the first conductor layer, the first conductor layer extending beyond the first adhesive layer;
- (C) A foam layer in direct contact with one facial side of the first adhesive layer;
- (D) A second adhesive layer in direct contact with the opposite facial side of foam layer;
- (E) A second conductor layer, e.g., copper foil, in direct contact with the second adhesive layer, the second conductor layer extending beyond the second adhesive layer such that the second conductor layer joins with the first conductor layer;
- (F) An electrically conductive third adhesive layer in direct contact with the facial surface opposite the facial surface that is in direct contact with the second conductor layer; and
- (G) An optional release liner in direct contact with the third adhesive layer.

14 Claims, 3 Drawing Sheets

CONDUCTIVE GROUNDING PAD

CROSS REFERENCE TO RELATED APPLICATION

The present application claims priority to U.S. patent application Ser. 61/365,837, filed on Jul. 20, 2010, the entire content of which is incorporated by reference herein.

FIELD OF THE INVENTION

This invention relates to grounding pads. In one aspect the invention relates to grounding pads comprising a single conductor layer and a single layer of compressive foam while in another aspect, the invention relates to grounding pads comprising two conductor layers separated by a single layer of compressive foam. In yet another aspect, the invention relates to electrical devices comprising one or the other of these grounding pads while in still another aspect, the invention relates to methods of constructing these grounding pads.

BACKGROUND OF THE INVENTION

Grounding pads, also known as electromagnetic interference (EMI) gaskets, are used in a variety of applications in which electromagnetic radiation can interfere in the operation of an electrical device, e.g., a cell phone, television, monitor or the like. These pads typically comprise an electrical conductor, e.g., copper foil, with means of joining the conductor to one or more electrical components within the device in which it, i.e., the pad, is located. These means include mechanical fasteners, welds, solder and conductive adhesives. Some pads also require a compressive feature, e.g., foam, so that they will conform to the space into which they are fitted, e.g., within the confines of a cell phone.

FIG. 1 is a schematic drawing of one such pad. Grounding pad 10 comprises copper conductor 11 folded into a Z-shape configuration. Top horizontal leg or layer 11a is electrically connected with bottom horizontal leg or layer 11c by diagonal leg 11b. In the space between conductor legs 11a and 11b is compressible foam 12a, and in the space between conductor legs 11b and 11c is compressible foam 12b. The foam may or may not be electrically conductive. On the external facial surfaces of conductor legs 11a and 11c is optional adhesive 13a and 13b, respectively. The adhesive is typically a pressure sensitive adhesive (PSA), and it is typically electrically conductive. In operation typically one horizontal leg of the Z-folded conductor is attached by the PSA to an electrically conductive shield while the other horizontal leg of the Z-folded conductor is attached by the PSA to an electrical ground, e.g., a ground trace of a printed circuit board. Alternatively, conductor legs 11a and 11c can attach to the shield and ground, respectively, by other means, e.g., weld, solder, mechanical fastener and the like. In the presence of electromagnetic radiation, e.g., static electricity, electrical current is captured by the shield and directed through the Z-folded conductor to the ground thus protecting the device in which the pad is located from damage.

While functional, current pads with a Z-shape folded conductor are difficult and expensive to manufacture. Foam is difficult to insert into the spaces between the legs of the folded conductor, and the connecting diagonal leg adds to the cost of manufacture. Accordingly, grounding pads with more cost effective designs and manufacturing processes are of interest to the various industries in which grounding pads are used.

SUMMARY OF THE INVENTION

In one embodiment the invention is a compressible grounding pad with two conductor layers separated by a compressible foam layer, the pad comprising:
 (A) A first conductor layer, e.g., copper foil, having opposing first (top) and second (bottom) facial surfaces;
 (B) A first adhesive layer having opposing first (top) and second (bottom) facial surfaces, the top facial surface of the first adhesive layer in direct contact with a part of the bottom facial surface of the first conductor layer, the first conductor layer extending beyond the first adhesive layer;
 (C) A foam layer having opposing first (top) and second (bottom) facial surfaces, the top facial surface of the foam layer in direct contact with the bottom facial surface of the first adhesive layer;
 (D) A second adhesive layer having opposing first (top) and second (bottom) facial surfaces, the top facial surface of the second adhesive layer in direct contact with the bottom facial surface of the foam layer;
 (E) A second conductor layer, e.g., copper foil, having opposing first (top) and second (bottom) facial surfaces, a part of the top facial surface of the second conductor layer in direct contact with the bottom facial surface of the second adhesive layer, the second conductor layer extending beyond the second adhesive layer such that a part of the top facial surface of the second conductor layer joins with a part of the bottom facial surface of the first conductor layer;
 (F) An electrically conductive third adhesive layer having opposing first (top) and second (bottom) facial surfaces, the top facial surface of the third adhesive layer in direct contact with the bottom facial surface of the second conductor layer; and
 (G) An optional release liner having opposing first (top) and second (bottom) facial surfaces, the top facial surface of the release Liner in direct contact with the bottom facial surface of the third adhesive layer.

The first and second conductor layers can be joined to one another by any one of a number of different means, e.g., welding, soldering, conductive adhesive, mechanical fastener, etc. The first and second adhesives and the foam are typically and preferably electrically non-conductive.

In one embodiment the invention is a compressible grounding pad with one conductor layer and one compressible foam layer, the pad comprising:
 (A) A conductor layer, e.g., copper foil, having opposing first (top) and second (bottom) facial surfaces;
 (B) A first adhesive layer having opposing first (top) and second (bottom) facial surfaces, the top facial surface of the first adhesive layer in direct contact with a part of the bottom facial surface of the conductor layer, the conductor layer extending beyond the first adhesive layer;
 (C) A foam layer having opposing first (top) and second (bottom) facial surfaces, the top facial surface of the foam layer in direct contact with the bottom facial surface of the first adhesive layer;
 (D) An electrically conductive second adhesive layer having opposing first (top) and second (bottom) facial surfaces, a part of the top facial surface of the second adhesive layer in direct contact with the bottom facial surface of the foam layer, the second adhesive layer extending beyond the foam layer such that a part of the top facial surface of the second adhesive layer joins with a part of the bottom facial surface of the conductor layer; and (E) An optional release liner having opposing first (top) and second (bottom) facial surfaces, the top facial surface of the release liner in direct contact with the bottom facial surface of the second adhesive layer.

The conductor and second adhesive layer are joined to one another through the natural action of the second adhesive layer. The first adhesive and the foam are typically and preferably electrically non-conductive.

In one embodiment the invention is a method of constructing a compressible grounding pad with two conductor layers separated by a compressible foam layer, the method comprising the steps of:

(A) Attaching a first conductor layer having opposing first and second facial surfaces to a compressible foam layer also having opposing first and second facial surfaces such that (1) the second facial surface of the first conductor layer is joined to the first facial surface of the foam layer, and (2) the first conductor layer extends beyond the foam layer to form an extended section of the first conductor layer that is not joined to the foam layer;

(B) Attaching a second conductor layer having opposing first and second facial surfaces to the compressible foam layer such that (1) the first facial surface of the second conductor layer is joined to the second facial surface of the foam layer, and (2) the second conductor layer extends beyond the foam layer to form an extended section of the second conductor layer that is not joined to the foam layer; and (C) Joining the second facial surface of the extended section of the first conductor layer with the first facial surface of the extended section of the second conductor layer.

In one embodiment the first and second conductor layers are joined to the foam layer by a PSA while the extended sections of the first and second conductor layers are joined to one another by a weld, solder, adhesive or mechanical fastener.

In one embodiment the invention is a method of constructing a compressible grounding pad with one conductor layer and one compressible foam layer, the method comprising the steps of:

(A) Attaching a conductor layer having opposing first and second facial surfaces to a compressible foam layer also having opposing first and second facial surfaces such that (1) the second facial surface of the conductor layer is joined to the first facial surface of the foam layer, and (2) the conductor layer extends beyond the foam layer to form an extended section of the conductor layer that is not joined to the foam layer;

(B) Attaching an electrically conductive adhesive layer having opposing first and second facial surfaces to the compressible foam layer such that (1) the first facial surface of the electrically conductive adhesive layer is joined to the second facial surface of the foam layer, and (2) the electrically conductive adhesive layer extends beyond the foam layer to form an extended section of the electrically conductive adhesive layer that is not joined to the foam layer; and (C) Joining the second facial surface of the extended section of the conductor layer with the first facial surface of the extended section of the electrically conductive adhesive layer.

In one embodiment the conductor layer is joined to the foam layer by a PSA while the extended sections of the conductor layer.

DETAILED DESCRIPTION OF THE PREFERRED EMBODIMENT

Figure 1:
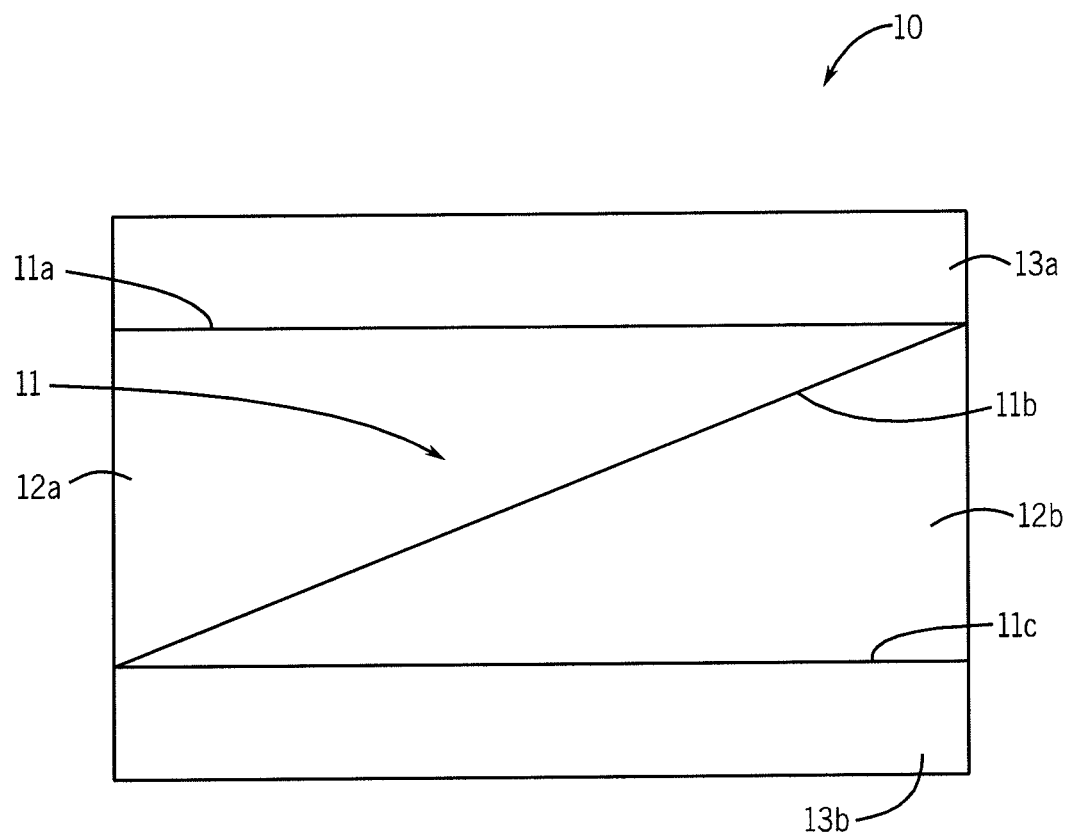
FIG. 1 is a schematic illustration of a prior art compressible grounding pad.

Unless stated to the contrary, implicit from the context, or customary in the art, all parts and percents are based on weight and all test methods are current as of the filing date of this disclosure. For purposes of United States patent practice, the contents of any referenced patent, patent application or publication are incorporated by reference in their entirety (or its equivalent US version is so incorporated by reference) especially with respect to the disclosure of synthetic techniques, product and processing designs, polymers, catalysts, definitions (to the extent not inconsistent with any definitions specifically provided in this disclosure), and general knowledge in the art.

The numbers and numerical ranges in this disclosure are approximate, and thus may include values outside of the range unless otherwise indicated. Numerical ranges include all values from and including the lower and the upper values, in increments of one unit, provided that there is a separation of at least two units between any lower value and any higher value. As an example, if a compositional, physical or other property, such as, for example, thickness, weight percentages, etc., is from 100 to 1,000, then the intent is that all individual values, such as 100, 101, 102, etc., and sub ranges, such as 100 to 144, 155 to 170, 197 to 200, etc., are expressly enumerated. For ranges containing values which are less than one or containing fractional numbers greater than one (e.g., 0.01, 0.1, 1.1, etc.), one unit is considered to be 0.001, 0.01 or 0.1, as appropriate. For ranges containing single digit numbers less than ten (e.g., 1 to 5), one unit is typically considered to be 0.1. These are only examples of what is specifically intended, and all possible combinations of numerical values between the lowest value and the highest value enumerated, are to be considered to be expressly stated in this disclosure. Numerical ranges and values are provided within this disclosure for, among other things, pad and layer dimensions.

"Comprising", "including", "having" and like terms are not intended to exclude the presence of any additional component, step or procedure, whether or not the same is specifically disclosed. In order to avoid any doubt, all compositions claimed through use of the term "comprising" may include one or more additional component substances, parts and/or materials unless stated to the contrary. In contrast, the term, "consisting essentially of" excludes from the scope of any succeeding recitation any other component, step or procedure, excepting those that are not essential to operability. The term "consisting of" excludes any component, step or procedure not specifically delineated or listed. The term "or", unless stated otherwise, refers to the listed members individually as well as in any combination.

"Facial surface", "planar surface", "top surface", "bottom surface" and the like are used in distinction to "edge surface". If rectangular in shape or configuration, a layer will comprise two opposing facial surfaces joined by four edge surfaces (two opposing pairs of edge surfaces, each pair intersecting the other pair at right angles). If circular in configuration, then the layer will comprise two opposing facial surfaces joined by one continuous edge surface. The layers can be of any size and shape and as such, so can the planar and edge surfaces, e.g., thin or thick, polygonal or circular, flat or wavy, etc.

"Pressure sensitive adhesive," "NA" and like terms mean an adhesive which bonds to an application surface as a result of applied pressure as opposed to the evaporation or absorption of a solvent to form a solid material bond.

"Direct contact", "intimate contact" and like terms mean that two surfaces or layers are in physical contact with one another so as to form an interface without an intermediate or intervening layer or material.

Grounding Pad Comprising Two-Conductor Layers

Figure 2:
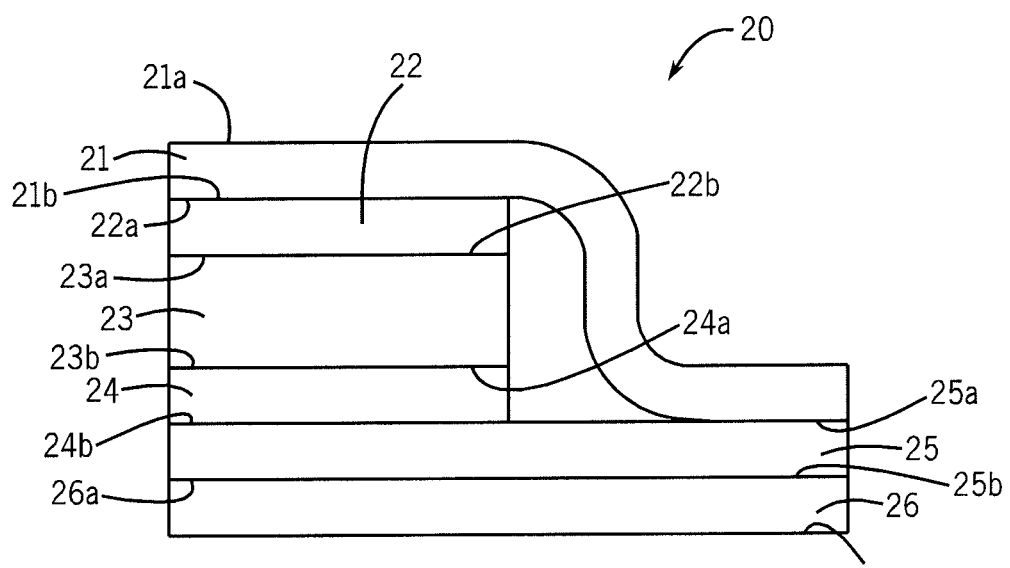
FIG. 2 is a schematic illustration of one embodiment of a compressible grounding pad of this invention with two conductor layers.

FIG. 2 is a schematic illustration of a compressible grounding pad with two conductor layers separated by a compressible foam layer. Compressible grounding pad 20 comprises first conductor layer 21 having opposing first or top facial surface 21a and second or bottom facial surface 21b. Conductor 21 can comprise any electrically conductive material, but typically comprises copper or aluminum. Typically and preferably conductor 21 is copper foil. Typically and preferably the conductor 21 has a thickness of 5 to 100, more typically of 20 to 50 and even more typically of 18 to 25, microns (μm).

Part of bottom facial surface 21b is in direct contact with first or top facial surface 22a of first adhesive layer 22 which can comprise any adhesive that exhibits good adhesion both to first conductor 21 and foam 23. Typically the adhesive is a PSA. These adhesives are well known in the art, widely available and include but are not limited to synthetic rubber based PSA, natural rubber based PSA and acrylic based PSA. These may be used alone or in combination with one another. Preferred PSA are acrylic based comprising a polymer of an alkyl ester of an acrylic acid or methacrylic acid as a main component. The adhesive is typically, but not necessarily, electrically non-conductive. Typically and preferably the first adhesive layer has a thickness of 10 to 100, more typically of 35 to 80 and even more typically of 35 to 50, microns (μm).

Bottom facial surface 22b is in direct contact with first or top facial surface 23a of foam 23 which can comprise any material that exhibits good compression properties. Representative foams include, but are not limited to, polyurethane, polyolefin (e.g., polyethylene, polypropylene, polyisoprene, etc.), natural and synthetic rubbers, and the like. The foam is typically electrically non-conductive, and it typically and preferably has a pre-compressive thickness of 0.3 to 10, more typically of 0.5 to 2 and even more typically of 0.5 to 1, microns (μm). The force necessary to compress the foam will depend, at least in part, on the grade of the foam and the end-use application of the grounding pad. Typically, the foam can compress to less than one-half of its pre-compressive thickness with minimal compressive force.

Bottom facial surface 23b is in direct contact with top facial surface 24a of second adhesive layer 24. Typically, but not necessarily, second adhesive layer 24 is of the same composition and thickness as first adhesive layer 22.

Bottom facial surface 24b is in direct contact with part of top facial surface 25a of second conductor 25 which typically, but not necessarily, has the same composition and thickness of first conductor layer 21. Both first conductor layers 21 and 25 extend beyond their respective neighboring adhesive layers 22 and 24 sufficiently far enough so as to form extended sections that (1) are not in direct contact with adhesive layers 22 and 24, and (2) can join with one another by any convenient means, e.g., welding, soldering, conductive adhesive, mechanical fastener (e.g., rivet, clip, etc.). The joining of the two conductor layers is such that (1) bottom facial surface 21b of first conductor layer 21 joins to top facial surface 25a of second conductor layer 25, and (2) an electrical current can flow from one conductor to the other conductor substantially unimpeded.

Bottom facial surface 25b is in direct contact with top facial surface 26a of third adhesive layer 26. Third adhesive layer 26 is also typically and preferably a PSA, but one that is electrically conductive. These adhesives can be of the same composition as the first and second adhesives but filled with electrically conductive particles, e.g., copper or aluminum metal, electrically conductive polymeric materials, etc. This third adhesive layer is sufficiently electrically conductive so as to pass any electrical current from the second conductor layer to the substrate surface (not shown) to which it is attached through bottom facial surface 26b. The third adhesive layer typically and preferably has a thickness of 10 to 150, more typically of 35 to 100 and even more typically of 35 to 50, microns (μm).

Adhesive layer 26 is optionally and preferably protected by a release liner until grounding pad 20 is ready for use. Bottom facial surface 26b is typically and preferably in direct contact with the top facial surface of the release liner (not shown). Release liners are well known in the art, and representative examples include, but are not limited to, glassine paper and plastic film treated, e.g., sprayed, with a releasing agent such as a silicone-base releasing agent.

Grounding Pad Comprising One Conductor Layer

Figure 3:
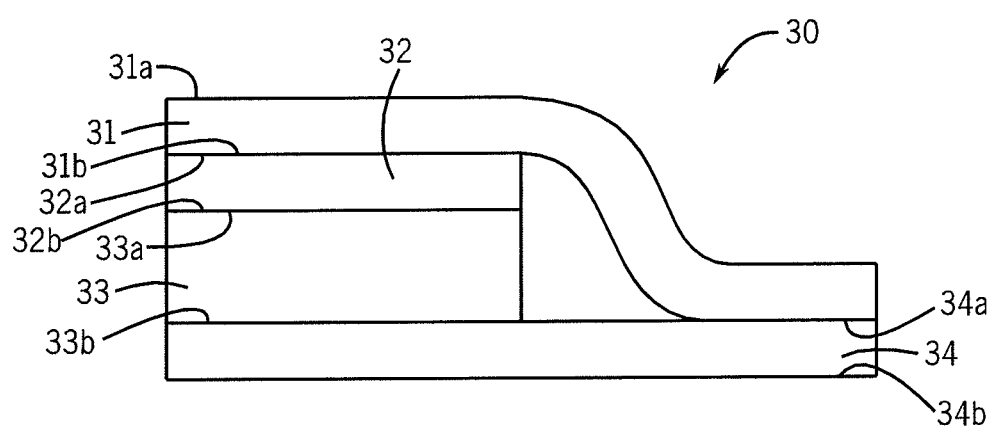
FIG. 3 is a schematic illustration of one embodiment of a compressible grounding pad of this invention with one conductor layer.

FIG. 3 is a schematic illustration of a compressible grounding pad with one conductor layer and one compressible foam layer. Compressible grounding pad 30 comprises conductor layer 31 having opposing first or top facial surface 31a and second or bottom facial surface 31b. Conductor 31 can comprise any electrically conductive material, but typically comprises copper or aluminum. Typically and preferably conductor 21 is copper foil. Typically and preferably conductor 31 has a thickness of 5 to 100 more typically of 20 to 50 and even more typically of 18 to 25, microns (μm).

Part of bottom facial surface 31b is in direct contact with first or top facial surface 32a of first adhesive layer 32 which can comprise any adhesive that exhibits good adhesion both to first conductor 31 and foam 33. Typically the adhesive is a PSA and is as described above for adhesive layers 22, 24 and 26. The adhesive is typically electrically non-conductive. Typically and preferably adhesive layer 32 has a thickness of 10 to 100, more typically of 35 to 80 and even more typically of 35 to 50, microns (μm).

Bottom facial surface 32b is in direct contact with first or top facial surface 33a of foam 33 which, like foam 23, can comprise any material that exhibits good compression properties. Representative foams include, but are not limited to, polyurethane, polyolefin (e.g., polyethylene, polypropylene, polyisoprene, etc.), natural and synthetic rubbers, and the like. The foam is typically electrically non-conductive, and it typically and preferably has a pre-compressive thickness of 0.3 to 10, more typically of 0.5 to 2 and even more typically of 0.5 to 1, microns (μm). The force necessary to compress the foam will depend, at least in part, on the grade of the foam and the end-use application of the grounding pad. Typically, the foam can compress to less than one-half of its pre-compressive thickness with minimal compressive force.

Bottom facial surface 33b of foam 33 is in direct contact with top facial surface 34a of electrically conductive adhesive layer 34. This adhesive can be of the same composition as adhesive layer 32 but filled with electrically conductive particles, e.g., copper or aluminum metal, electrically conductive polymeric materials, etc. Adhesive layer 34 is sufficiently electrically conductive so as to pass any electrical current from the second conductor layer to the substrate surface (not shown) to which it is attached through bottom facial surface 34b. Adhesive layer 34 typically and preferably has a thickness of 10 to 100, more typically of 35 to 80 and even more typically of 35 to 50, microns (μm).

Both conductor layer 31 and electrically conductive adhesive layer 34 extend beyond their respective neighboring adhesive layer 32 and foam 33 sufficiently far enough so as to form extended sections that (1) are not in direct contact with adhesive layer 32 and foam 33, and (2) can join with one another such that (a) bottom facial surface 31b of conductor layer 31 joins to top facial surface 34a of adhesive layer 34, and (b) an electrical current can flow from the conductor to the electrically conductive adhesive substantially unimpeded.

Adhesive layer 34 is optionally and preferably protected by a release liner until grounding pad 30 is ready for use. Bottom facial surface 34b is typically and preferably in direct contact with the top facial surface of the release liner (not shown).

Construction of a Grounding Pad Comprising Two Conductor Layers

Figure 4:
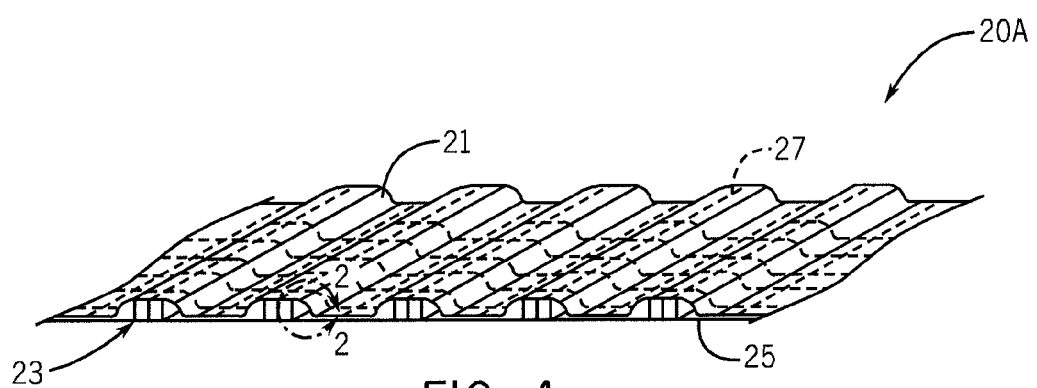
FIG. 4 is a schematic illustration of one embodiment of a sheet of grounding pads comprising two conductor layers separated by a compressible foam layer and before die cutting the sheet into individual grounding pads.

One method of constructing the compressible grounding pad with two conductor layers separated by a compressible foam layer is illustrated in FIG. 4. This method comprises the steps of:

(A) Attaching first conductor layer 21 having opposing first and second facial surfaces to compressible foam layer 23 also having opposing first and second facial surfaces such that (1) the second facial surface of the first conductor layer is joined to the first facial surface of the foam layer, and (2) the first conductor layer extends beyond the foam layer to form an extended section of the first conductor layer that is not joined to the foam layer;

(B) Attaching second conductor layer 25 having opposing first and second facial surfaces to compressible foam layer 23 such that (1) the first facial surface of the second conductor layer is joined to the second facial surface of the foam layer, and (2) the second conductor layer extends beyond the foam layer to form an extended section of the second conductor layer that is not joined to the foam layer; and (C) Joining the second facial surface of the extended section of first conductor layer 21 with the first facial surface of the extended section of second conductor layer 25.

The two conductor layers are joined to the foam layer by way of an adhesive (not shown), and the two conductor layers are joined to one another by any suitable means, typically welding, using any one of a number of techniques well known in the art. The adhesive can be applied to the conductors and/or foam also by any one of a number of different methods, but typically the adhesive is first applied to the foam by coating or spraying, and then the conductors are brought into contact with the adhesive already on the foam. For conductor layer 25 the electrically conductive adhesive (26 in FIG. 2) can be applied before or after it (conductor layer 25) is joined to foam 23 and/or conductor layer 21. Typically a release liner (not shown) covers the electrically conductive adhesive before it is applied to conductor layer 25. Once sheet of grounding pads 20A is constructed, the individual grounding pads (20 in FIG. 2) are produced by die cutting the sheet along die cut lines 27. The grounding pads can be cut to any size and configuration that preserves the layer configuration of FIG. 2.

Construction of a Grounding Pad Comprising One Conductor Layer

Figure 5:
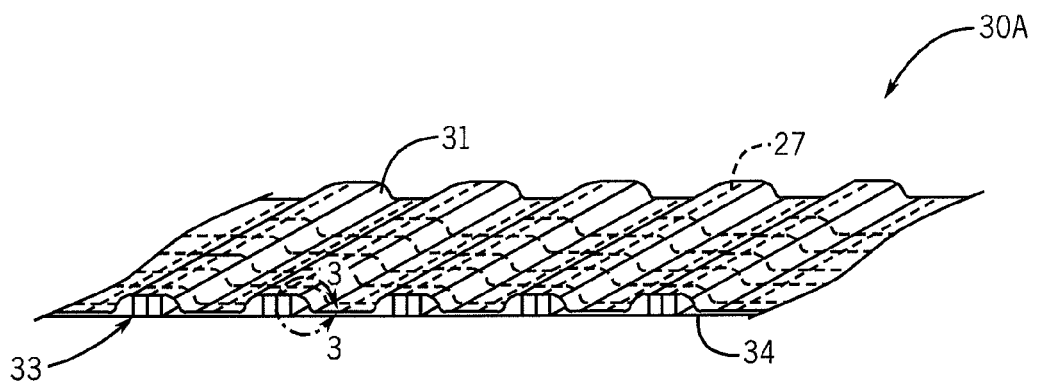
FIG. 5 is a schematic illustration of one embodiment of a sheet of grounding pads comprising one conductor layer and one compressible foam layer and before die cutting the sheet into individual grounding pads.

One method of constructing the compressible grounding pad with one conductor layer and one compressible foam layer is illustrated in FIG. 5. This method comprises the steps of:

(A) Attaching conductor layer 31 having opposing first and second facial surfaces to compressible foam layer 33 also having opposing first and second facial surfaces such that (1) the second facial surface of conductor layer 31 is joined to the first facial surface of foam layer 33, and (2) conductor layer 31 extends beyond foam layer 33 to form an extended section of conductor layer 31 that is not joined to foam layer 33;

(B) Attaching electrically conductive adhesive layer 34 having opposing first and second facial surfaces to compressible foam layer 33 such that (1) the first facial surface of electrically conductive layer 34 is joined to the second facial surface of foam layer 33 and (2) electrically conductive adhesive layer 34 extends beyond foam layer 33 to form an extended section of electrically conductive adhesive layer 34 that is not joined to foam layer 33; and (C) Joining the second facial surface of the extended section of conductor layer 31 with the first facial surface of the extended section of the electrically conductive adhesive layer 34.

The conductor layer is joined to the foam layer by way of an adhesive (not shown), and the conductor layer is joined to the electrically conductive adhesive through the action of the adhesive. The adhesive can be applied to the conductor and/or foam by any one of a number of different methods, but typically the adhesive is first applied to the foam by coating or spraying, and then the conductor is brought into contact with the adhesive already on the foam. Electrically conductive adhesive 34 can be applied before or after conductor layer 31 is joined to foam 33. Typically a release liner (not shown) covers the electrically conductive adhesive before it is applied to foam layer 33. Once sheet of grounding pads 30A is constructed, the individual grounding pads (30 in FIG. 3) are produced by die cutting the sheet along die cut lines 27. The grounding pads can be cut to any size and configuration that preserves the layer configuration of FIG. 3.

The methods of this invention for constructing grounding pads comprising one or two conductor layers and a compressible foam are extremely efficient and cost effective. They minimize conductor waste, e.g., they eliminate diagonal leg 11b in FIG. 1, and they allow the production of large numbers in a relatively few steps. They also allow the production of very thin products since the compressibility of the pad is not related to the stiffness or thickness of the conductor layers. Rather compressibility is a function of the foam. This, in turn, allows for changing the physical properties of the pad by changing the foam, and not the production tooling.

The grounding pads of this invention are used for, among other things, connecting an electrically conductive shield to an electrical ground. This conductive interface is often required when mating surfaces of an electronic apparatus that are not exactly conformably dimensioned, e.g., gaps, voids and spaces are formed with the two surfaces are mated. This is common in such electrical devices as cell phones, calculators, instant messengers, cameras and the like. The compressible grounding pads of this invention fill these gaps, voids, etc., upon compression. Moreover, upon compression, the electrical conductivity of the electrical conductive adhesive increases because the electrical conducting particles within the adhesive are brought closer to one another.

Although the invention has been described with certain detail through the preceding specific embodiments, this detail is for the primary purpose of illustration. Many variations and modifications can be made by one skilled in the art without departing from the spirit and scope of the invention as described in the following claims.

What is claimed is:

1. A compressible grounding pad with two conductor layers separated by a compressible foam layer, the pad comprising:
   (A) A first conductor layer having opposing first (top) and second (bottom) facial surfaces;
   (B) A first adhesive layer having opposing first (top) and second (bottom) facial surfaces, the top facial surface of the first adhesive layer in direct contact with a part of the bottom facial surface of the first conductor layer, the first conductor layer extending beyond the first adhesive layer;
   (C) A foam layer having opposing first (top) and second (bottom) facial surfaces, the top facial surface of the foam layer in direct contact with the bottom facial surface of the first adhesive layer;
   (D) A second adhesive layer having opposing first (top) and second (bottom) facial surfaces, the top facial surface of the second adhesive layer in direct contact with the bottom facial surface of the foam layer;
   (E) A second conductor layer having opposing first (top) and second (bottom) facial surfaces, a part of the top facial surface of the second conductor layer in direct contact with the bottom facial surface of the second adhesive layer, the second conductor layer extending beyond the second adhesive layer such that a part of the top facial surface of the second conductor layer joins with a part of the bottom facial surface of the first conductor layer;
   (F) An electrically conductive third adhesive layer having opposing first (top) and second (bottom) facial surfaces, the top facial surface of the third adhesive layer in direct contact with the bottom facial surface of the second conductor layer; and
   (G) An optional release liner having opposing first (top) and second (bottom) facial surfaces, the top facial surface of the release liner in direct contact with the bottom facial surface of the third adhesive layer.

2. The grounding pad of claim 1 in which each of the first and second conductor layers comprises at least one of copper and aluminum.

3. The grounding pad of claim 2 in which each of the adhesive layers comprises a pressure sensitive adhesive.

4. The grounding pad of claim 3 in which the first and second conductor layers are joined to one another by at least one of welding, soldering and adhesive.

5. An electronic apparatus comprising the grounding pad of claim 1.

6. The electronic apparatus of claim 5 in the form of a cell phone, calculator or instant messaging device.

7. A compressible grounding pad with one conductor layer and one compressible foam layer, the pad comprising:
   (A) A conductor layer having opposing first (top) and second (bottom) facial surfaces;
   (B) A first adhesive layer having opposing first (top) and second (bottom) facial surfaces, the top facial surface of the first adhesive layer in direct contact with a part of the bottom facial surface of the conductor layer, the conductor layer extending beyond the first adhesive layer;
   (C) A foam layer having opposing first (top) and second (bottom) facial surfaces, the top facial surface of the foam layer in direct contact with the bottom facial surface of the first adhesive layer;
   (D) An electrically conductive second adhesive layer having opposing first (top) and second (bottom) facial surfaces, a part of the top facial surface of the second adhesive layer in direct contact with the bottom facial surface of the foam layer, the second adhesive layer extending beyond the foam layer such that a part of the top facial surface of the second adhesive layer joins with a part of the bottom facial surface of the conductor layer; and
   (E) An optional release liner having opposing first (top) and second (bottom) facial surfaces, the top facial surface of the release liner in direct contact with the bottom facial surface of the second adhesive layer.

8. The grounding pad of claim 7 in which each of the first and second conductor layers comprises at least one of copper and aluminum.

9. The grounding pad of claim 8 in which each of the adhesive layers comprises a pressure sensitive adhesive.

10. An electronic apparatus comprising the grounding pad of claim 7.

11. The electronic apparatus of claim 10 in the form of a cell phone, calculator or instant messaging device.

12. A method of constructing a compressible grounding pad with two conductor layers separated by a compressible foam layer, the method comprising the steps of:
    (A) Attaching a first conductor layer having opposing first and second facial surfaces to a compressible foam layer also having opposing first and second facial surfaces such that (1) the second facial surface of the first conductor layer is joined to the first facial surface of the foam layer, and (2) the first conductor layer extends beyond the foam layer to form an extended section of the first conductor layer that is not joined to the foam layer;
    (B) Attaching a second conductor layer having opposing first and second facial surfaces to the compressible foam layer such that (1) the first facial surface of the second conductor layer is joined to the second facial surface of the foam layer, and (2) the second conductor layer extends beyond the foam layer to form an extended section of the second conductor layer that is not joined to the foam layer; and
    (C) Joining the second facial surface of the extended section of the first conductor layer with the first facial surface of the extended section of the second conductor layer.

13. The method of claim 12 in which the first conductor and second conductor layers are attached to the foam with an adhesive.

14. The method of claim 13 in which the first and second conductors are joined to one another by one of welding, soldering and the use of an adhesive.

* * * * *